United States Patent
Ding

(10) Patent No.: US 11,578,973 B2
(45) Date of Patent: Feb. 14, 2023

(54) METHOD FOR AUTOMATICALLY NOTIFYING AN INTENDED PERSON AS WELL AS A TEST AND MEASUREMENT DEVICE

(71) Applicant: Rohde & Schwarz GmbH & Co. KG, Munich (DE)

(72) Inventor: Chow Han Ding, Singapore (SG)

(73) Assignee: Rohde & Schwarz GmbH & Co. KG, Munich (DE)

( * ) Notice: Subject to any disclaimer, the term of this patent is extended or adjusted under 35 U.S.C. 154(b) by 149 days.

(21) Appl. No.: 15/999,136

(22) Filed: Aug. 16, 2018

(65) Prior Publication Data
US 2019/0078878 A1  Mar. 14, 2019

(30) Foreign Application Priority Data
Sep. 14, 2017 (EP) .................................... 17191045

(51) Int. Cl.
| | | |
|---|---|---|
| *G01B 21/04* | (2006.01) | |
| *G06F 9/54* | (2006.01) | |
| *G06F 16/95* | (2019.01) | |
| *G01R 35/00* | (2006.01) | |
| *G05B 23/02* | (2006.01) | |

(52) U.S. Cl.
CPC ........... *G01B 21/042* (2013.01); *G01R 35/00* (2013.01); *G05B 23/0283* (2013.01); *G06F 9/541* (2013.01); *G06F 16/95* (2019.01)

(58) Field of Classification Search
CPC ....... G01B 21/042; G06F 16/95; G06F 9/541; G01R 35/00; G05B 23/0283
See application file for complete search history.

(56) References Cited

U.S. PATENT DOCUMENTS

| | | | | |
|---|---|---|---|---|
| 2003/0149526 A1* | 8/2003 | Zhou | ...................... | G08C 17/02 |
| | | | | 701/408 |
| 2007/0260735 A1* | 11/2007 | Olsson | .................... | H04L 43/50 |
| | | | | 709/227 |
| 2008/0246629 A1* | 10/2008 | Tsui | .................... | H02J 2207/40 |
| | | | | 340/870.07 |
| 2009/0012730 A1 | 1/2009 | Cross, Jr. et al. | | |
| 2013/0080107 A1 | 3/2013 | Flores, Jr. et al. | | |

(Continued)

FOREIGN PATENT DOCUMENTS

JP   2006342766 A   12/2006

OTHER PUBLICATIONS

Jin et al., Minimize Production Loss in Device Testing via Condition-Based Equipment Maintenance, IEEE, vol. 7, No. 4, Oct. 2010 (Year: 2010).*

(Continued)

*Primary Examiner* — Raymond L Nimox
(74) *Attorney, Agent, or Firm* — Christensen O'Connor Johnson Kindness PLLC

(57) ABSTRACT

A method for automatically notifying an intended person of a service interval of a test and measurement device by using the test and measurement device is described, wherein service data is received by the test and measurement device. The service data is processed internally. A time for maintenance is calculated automatically based on the service data retrieved. Further, a test and measurement device is described.

20 Claims, 2 Drawing Sheets

(56) References Cited

U.S. PATENT DOCUMENTS

| | | | |
|---|---|---|---|
| 2013/0283256 A1* | 10/2013 | Proud | G08C 17/02 |
| | | | 717/172 |
| 2015/0347701 A1* | 12/2015 | Atkin | G06F 19/3418 |
| | | | 705/2 |
| 2016/0012707 A1* | 1/2016 | McKinley | G08B 21/187 |
| | | | 340/679 |
| 2016/0253464 A1* | 9/2016 | Balwani | G06Q 50/22 |
| | | | 705/2 |
| 2017/0004421 A1 | 1/2017 | Gatson et al. | |
| 2017/0061074 A1* | 3/2017 | Singh | G16H 10/60 |
| 2017/0211498 A1 | 7/2017 | Moore et al. | |
| 2018/0075222 A1* | 3/2018 | Chen | G01N 33/66 |

OTHER PUBLICATIONS

Jin et al., Reliability Prognostics for Electronics via Built-in Diagnostic Tools, IEEE, 978-1-4244-8856-8/11, 2011 (Year: 2011).*

Jin, T., et al., "Minimize Production Loss in Device Testing via Condition-Based Equipment Maintenance," IEEE Transactions on Automation Science and Engineering 7(4):958-963, Oct. 2010.

Jin, T., et al., "Reliability Prognostics for Electronics via Built-in Diagnostic Tools," 2011 Proceedings—Annual Reliability and Maintainability Symposium, Jan. 2011, 7 pages.

Reitze, D.D., "Using Cloud Computing to Enhance Automatic Test Equipment Testing and Maintenance Capabilities," IEEE AUTOTESTCON, IEEE Press, Oct. 2013, 6 pages.

* cited by examiner

METHOD FOR AUTOMATICALLY NOTIFYING AN INTENDED PERSON AS WELL AS A TEST AND MEASUREMENT DEVICE

FIELD OF THE DISCLOSURE

Embodiments of the present disclosure relate generally to a method for automatically notifying an intended person of a service interval of a test and measurement device. Further, embodiments of the present disclosure also relate generally a test and measurement device.

BACKGROUND

Test and measurement devices are typically service checked by service personnel on a regular basis. For instance, a calibration of a test and measurement device is done each twelve months. However, this time interval relates to a rule of thumb. The service personnel may contact the user of the test and measurement device when the time interval (of twelve months) ends in order to arrange with the user of the test and measurement device for a service check of the test and measurement device. Alternatively, the user of the test and measurement device has to contact the service personnel in order to arrange for a service check. In general, this concept relates to a passive service check as at least one of the service personnel and the user has to determine or think of the upcoming time for maintenance.

Modern test and measurement devices (also called instruments), have internal meters which are read out manually by the service personnel during the service check in order to obtain a better overview of the test and measurement device. For instance, the internal meter corresponds to a counter for time and usage. However, the information gathered by the internal meters is not provided to the user of the test and measurement device such that the user does not know whether the calibration or any other service check is due or not. In fact, the user can only gather this information during the service check itself.

Therefore, service checks are performed based upon a rough estimation of the usage of the test and measurement device without exact knowledge of the usage characteristics of the test and measurement device.

Accordingly, there is a need for a more reliable opportunity to verify whether a service check is due or not.

SUMMARY

Embodiments of the present disclosure provide a method for automatically notifying an intended person of a service interval of a test and measurement device by using the test and measurement device, with the following steps:

Retrieving service data by the test and measurement device;

Processing the service data internally; and

Calculating a time for maintenance automatically based on the service data retrieved.

Further, embodiments of the present disclosure also provide a test and measurement device with an active service check calculation unit that is configured to calculate a time for maintenance for the test and measurement device automatically, for example wherein a processing unit is provided that is configured to perform a method as described above automatically.

In fact, modern test and measurement devices are enabled to obtain information required to automatically calculate due times for a service check of the test and measurement device itself. Thus, it is no more necessary that at least one of the user and the service personnel has to calculate the upcoming service interval manually. Further, the test and measurement device can be used in a most efficient manner since it can be used the fully available usage hours within a service interval. In addition, the user gets informed by the test and measurement device itself such that the user can use the test and measurement device until the due date for the service check. In other words, the test and measurement device itself knows exactly when it should be service checked. Therefore, the user may use the test and measurement device until the user is prompted by the test and measurement device itself to carry out the service check. This can be ensured by the automatic calculation of the time for maintenance as well as the appropriate notification such that the test and measurement device will not be service checked too late or too early. As the time for maintenance is calculated automatically by the test and measurement device, no manual input is required which might be a source of error. As the person intended gets notified automatically, an automatic notification is provided by the test and measurement device itself.

In addition, the user, being the intended person, gets educated when calibration and other service checks of the test and measurement device shall occur in order to keep the test and measurement device in a calibrated or rather in an operational state.

In general, the test and measurement device comprises the active service check calculation unit as the time for maintenance is calculated in an active and automatic manner, for example internally. The active service check calculation unit may comprise the processing unit that performs the method described above appropriately. Accordingly, a smart test and measurement device is provided as it can calculate its time for maintenances automatically without any manual input, for example its calibration time(s).

The service interval corresponds to a scheduled service that should take place regularly. In fact, the test and measurement device as well as the method ensure that the regularly service (check) is done while calculating the time for maintenance automatically based on service data received.

Thus, unforeseen events or rather down times of the test and measurement device due to failures of electronic components are not predicted or rather taken into account while investigating degradation of these electronic components.

In fact, it is only ensured that the test and measurement device is always in a calibrated state while calculating the respective time for maintenance of the test and measurement device. These times for maintenance correspond to the regularly scheduled services or rather service checks which are necessary to keep the test and measurement device in its calibrated state. It is avoided that a test and measurement device is used for testing purposes which is no more calibrated or which calibration has expired.

Therefore, the calibration time(s) of the test and measurement device are calculated automatically which are different to repairs of fault electronic components.

In general, the test and measurement device has a housing that encompasses the active service check calculation unit and/or the processing unit. Hence, all components used for calculating the time for maintenance are housed in the housing of the test and measurement device. Therefore, the respective steps are done internally without usage of separately formed devices.

In some embodiments, a self-check of the single device, namely the test and measurement device, is done.

According to an aspect, the service data comprises information for predictive servicing of the test and measurement device. Thus, the service data retrieved comprises information that can be processed internally in order to predict the upcoming time for maintenance of the test and measurement device, for example the end of the actual service interval.

According to another aspect, the service data comprises at least one of internal data and external data. The internal data relates to data that is generated by the test and measurement device itself, for example internal components, whereas the external data relates to data that is gathered by the test and measurement device via at least one communication interface, for instance a Bluetooth, near field communication or Wi-Fi interface. Accordingly, the test and measurement device is configured to communicate with other units or devices such as a server providing data that can be used to calculate the time for maintenance of the test and measurement device.

According to an embodiment, the internal data comprises internal measurement data of the test and measurement device. Thus, the test and measurement device has internal sensors for measuring data, for instance counters which are also called meters. The data measured may be used for calculating the time(s) for maintenance, for example wherein the data corresponds to usage data of the test and measurement device.

For instance, the internal measurement data comprises data related to at least one of movements of the test and measurement device, power on and power off cycles, idle time, usage time, expected lifetime, number of failed self alignments, and temperature profiles. Thus, these different measurement data may be gathered and used by the test and measurement device to internally and automatically calculate the (upcoming) time for maintenance of the test and measurement device. All these different measurement data correspond to conditions and circumstances that influence the service interval of the test and measurement device. Accordingly a more reliable determination of the end of the service interval, namely the time for maintenance, for the individual test and measurement device is possible as the determination is inter alia based on data gathered by the test and measurement device itself. The expected lifetime may be calculated in a reverse manner by taking the mean time between failures or other statistically pre-calculated life time values into account. The temperature profiles particularly comprise temperature changes to which the test and measurement device was exposed. In addition, the number of failed self alignments in the past is taken into account by the test and measurement device for determining its time for maintenance.

The above mentioned internal measurement data is used by the test and measurement device to check its own current status.

For instance, the movements of the test and measurement device are monitored by an integrated gyrometer wherein the temperature profiles may be monitored by an integrated temperature sensor.

Thus, the test and measurement device may comprise at least one internal sensor, for example wherein the sensor is at least one of a gyrometer, a temperature sensor, a meter, and a counter.

Moreover, the internal data may comprise data of at least one of a previous maintenance record stored internally and an internal calibration record. Therefore, the test and measurement device is enabled to verify its own current status based upon the internal data corresponding to previous services and/or calibrations. Moreover, the service history of the test and measurement device can be understood provided that this information, namely a previous maintenance record, is stored internally.

According to another aspect, the external data comprises data retrieved via the internet. Therefore, the test and measurement device may comprise a Bluetooth, a near field communication interface (NFC interface), a local area network communication interface (LAN communication interface) and/or a wireless local area network communication interface (WLAN communication interface). The test and measurement device is configured to retrieve data from the internet directly by using a respective communication interface, for instance from a service provider of the test and measurement device.

Alternatively or supplementarily, the test and measurement device may connect to another web-enabled device such as a tablet, a mobile phone or a smartphone via its communication interface in order to establish an internet connection for accessing external data via the internet indirectly.

Moreover, the data retrieved via the internet may comprise data of a previous maintenance record. For instance, the previous maintenance record was uploaded to a cloud (server) previously which is accessed by the test and measurement device in order to download and process the respective data appropriately. Accordingly, the test and measurement device is enabled to verify its own service history and to use this information for calculating the time of maintenance.

Alternatively or supplementarily, the data retrieved via the internet comprises data received from other test and measurement devices of the same kind. Thus, the test and measurement devices of the same kind upload their respective data in order to exchange the data via the internet with each other. This data may be uploaded to a cloud provided by the service provider in order to be shared appropriately. Further, this data can be exchanged live such that the external data is real time data. Generally, it is ensured that the different test and measurement devices are configured to learn from each other. For instance, machine learning algorithms are applied on the different data obtained in order to generate a model for at least one of the different parameters used for calculating the time for maintenance. This ensures that the time for maintenance can be calculated internally in an optimal manner even though information with regard to some of the parameters is not available for the respective test and measurement device. The distribution of the data via the cloud or rather the data exchange among each other ensures that anomalies or other effects may be detected and taken into account.

According to an aspect, the external data comprises environmental data of the test and measurement device, for example wherein the environmental data comprises weather information based on the geographic location of the test and measurement device. The information regarding the location of the test and measurement device are also taken into account in order to calculate the time for maintenance of the test and measurement device. For instance, an installation location being humid shortens the service interval of the test and measurement device such that the next time for maintenance is earlier. While taking the weather information into account, changes of the weather are also taken into account in order to determine the time for maintenance.

In general, the environmental data may comprise information with regard to rain, sunshine, temperature and/or altitude or other weather information gathered.

The test and measurement device may comprise an integrated Global Position System (GPS) unit for determining the geographic position. Alternatively or supplementarily, the test and measurement device connects with another device having such a GPS unit, for instance a smartphone.

According to an embodiment, at least one of a user of the test and measurement device and service personnel is notified. Thus, the user and/or the service personnel are/is the intended person. Accordingly, an appointment can be arranged automatically provided that both the user and the service personnel are notified simultaneously wherein the notification comprises an invitation for the service check that can be accepted by the user.

Moreover, a notification may be outputted about at least one of an upcoming service and a service already due, for example wherein the notification is outputted by at least one of a graphic displayed, a light signal emitted, a sound generated, a message sent, and an information displayed on an end device of the intended person. Accordingly, at least the user of the test and measurement device is informed about an already due service or an upcoming service. For instance, this information is provided by displaying the remaining time until the next service check is due. Alternatively, an already due service check is displayed.

The test and measurement device may comprise a display used for displaying a graphic that informs the user. For instance, a countdown is displayed which ensures that the user gets informed in advance.

Alternatively or supplementarily, a light signal and/or a sound are/is outputted in order to inform the user of the test and measurement device. Accordingly, the test and measurement device has a light emitting unit, such as an LED, etc., or a loudspeaker.

Moreover, the intended person, for instance at least one of the user of the test and measurement device and service personnel, is informed by sending a message, for example a push notification, an email or a text message. For instance, the user of the test and measurement device and the service personnel are informed simultaneously. The notification may be done via a mobile device application that may run on an end device such as a tablet, a mobile phone or a smartphone. This notification, for example the push message to the application, may also be forwarded to a service department such that the service personnel is also notified.

In some embodiments, an information of the test and measurement device is forwarded when notifying the intended person. Thus, the intended person, for instance the service personnel, gets informed about the current status of the test and measurement device, for example any errors that has occurred during the last service interval. Moreover, the serial number of the test and measurement device may be forwarded to the service department such that the service department is enabled to contact the user of the test and measurement device for arranging for the service check. The contact information of the user may be stored separately which can only be accessed by the service department wherein the contact information is linked to the serial number forwarded.

For instance, a threshold value is provided wherein the notification is output when the threshold value is at least one of reached and exceeded. The threshold value may relate to data retrieved by internal meters. Once a threshold value is reached or exceeded, the notification is outputted in order to ensure that the service will take place at the right time.

Moreover, the threshold value may relate to the days left until the due date. Thus, the threshold value may be defined such that it is ensured that enough time is left in the service interval to ensure that the next service check is done within the service interval, namely prior to the due date (time for maintenance) calculated.

The test and measurement device, for example its active service check calculation unit or its processing unit, is configured in some embodiments to perform the different aspects mentioned above in an automatic manner.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
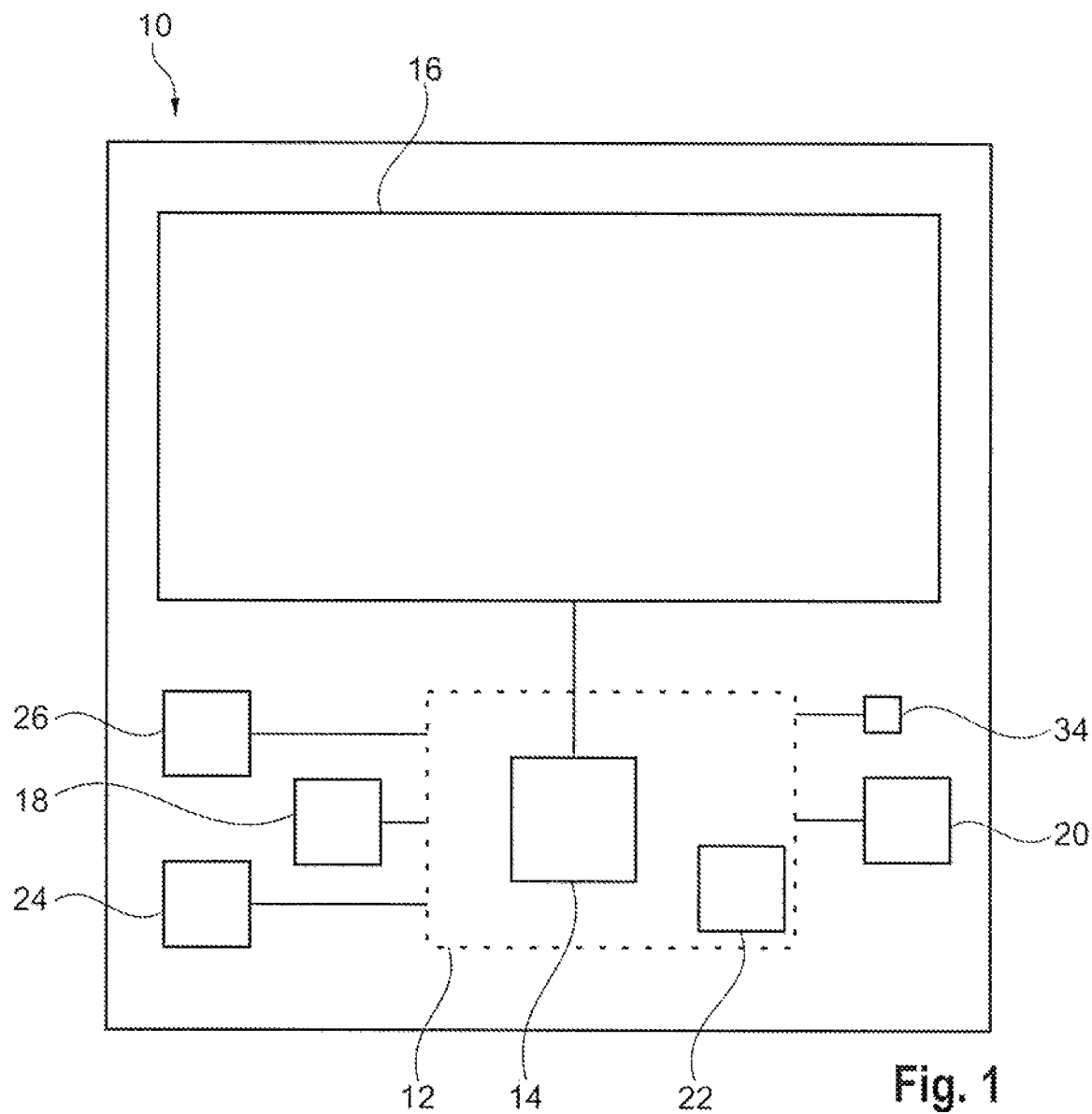
FIG. 1 schematically shows a test and measurement device according to an embodiment of the present disclosure.

In FIG. 1, a test and measurement device 10 is shown that comprises an active service check calculation unit 12. The active service check calculation unit 12 is configured, for example, to automatically calculate a time for maintenance for the test and measurement device 10 such that an intended person, for instance the user of the test and measurement device 10 or service personnel, can be notified with regard to the service interval of the test and measurement device 10, for example wherein the intended person is notified that the service check is already due or that it becomes due in the near future.

For this purposes, the active service check calculation unit 12 has a processing unit 14 that is connected to a display 16 for displaying information and/or data gathered by the test and measurement device 10. Usually, the display 16 is used for displaying the measured signal(s) or any other information related to the tests and measurements performed. However, the display 16 can also be used for notifying the user of the test and measurement device 10 with regard to the time for maintenance calculated.

As will be described hereinafter, the active service check calculation unit 12 takes service data into account that are processed internally in order to calculate the time for maintenance in a reliable manner for the individual test and measurement device 10. The service data taken into account comprises information that can be processed by the active service check calculation unit 12 in order to provide predictive servicing of the test and measurement device 10.

In the shown embodiment, the test and measurement device 10 has an internal sensor 18 for obtaining measurement data related to internal service data of the test and measurement device 10. The internal sensor 18 is connected to the active service check calculation unit 12 such that its processing unit 14 receives the data gathered for further processing. The internal sensor 18 may be, for example, a counter, a gyrometer or a temperature sensor for obtaining respective information as will be described later. In general, the test and measurement device 10 may have several internal sensors 18 for obtaining different data or rather information.

The test and measurement device 10 in some embodiment includes at least one communication interface 20 that is connected to the active service check calculation unit 12, for example the processing unit 14. The communication interface 20 ensures that the test and measurement device 10 is enabled to communicate with other devices and units in order to forward and/or receive information. For instance, the communication interface 20 may include at least one of Bluetooth interface, a near field communication (NFC) interface, a wireless local area network (WLAN) interface or a local area network (LAN) interface, etc., or any combination thereof.

Depending on the respective implementation of the communication interface 20, the test and measurement device 10 is configured to communicate over the internet directly or indirectly via a web-enabled end device. The web-enabled end device may communicate with the test and measurement device 10 via the communication interface 20, for example the NFC interface, in order to establish an internet connection.

The test and measurement device 10 has an internal memory 22 that may be part of the active service check calculation unit 12 as shown in FIG. 1. Alternatively, the active service check calculation unit 12 is connected to a separately formed internal memory 22. The processing unit 14 is connected to the internal memory 22 such that the processing unit 14 is enabled to access the memory 22 in order to read out data for further processing that is stored in the memory 22. In addition, the processing unit 14 is configured to store data obtained via the communication interface 20 in order to provide data that may be processed later.

The test and measurement device 10 may also comprise in some embodiments a light emitting unit 24 and/or a loudspeaker 26, which are connected to the active service check calculation unit 12 in order to output a notification, for example an optical or rather acoustic notification.

Generally, the light emitting unit 24 and the loudspeaker 26 each correspond to an output unit for notification. The notification generated by the active service check calculation unit 12 relates, for example, to a service check, including but not limited to a time for maintenance, of the test and measurement device 10. This notification may also be outputted via the display 16 as a graphic illustration on a graphic user interface displayed, for instance a countdown, and/or a message sent via the communication interface 20, for instance an e-mail, a text message or a push notification.

In general, the notification is directed to an intended person wherein the intended person may be the user of the test and measurement device 10 and/or service personnel.

Figure 2:
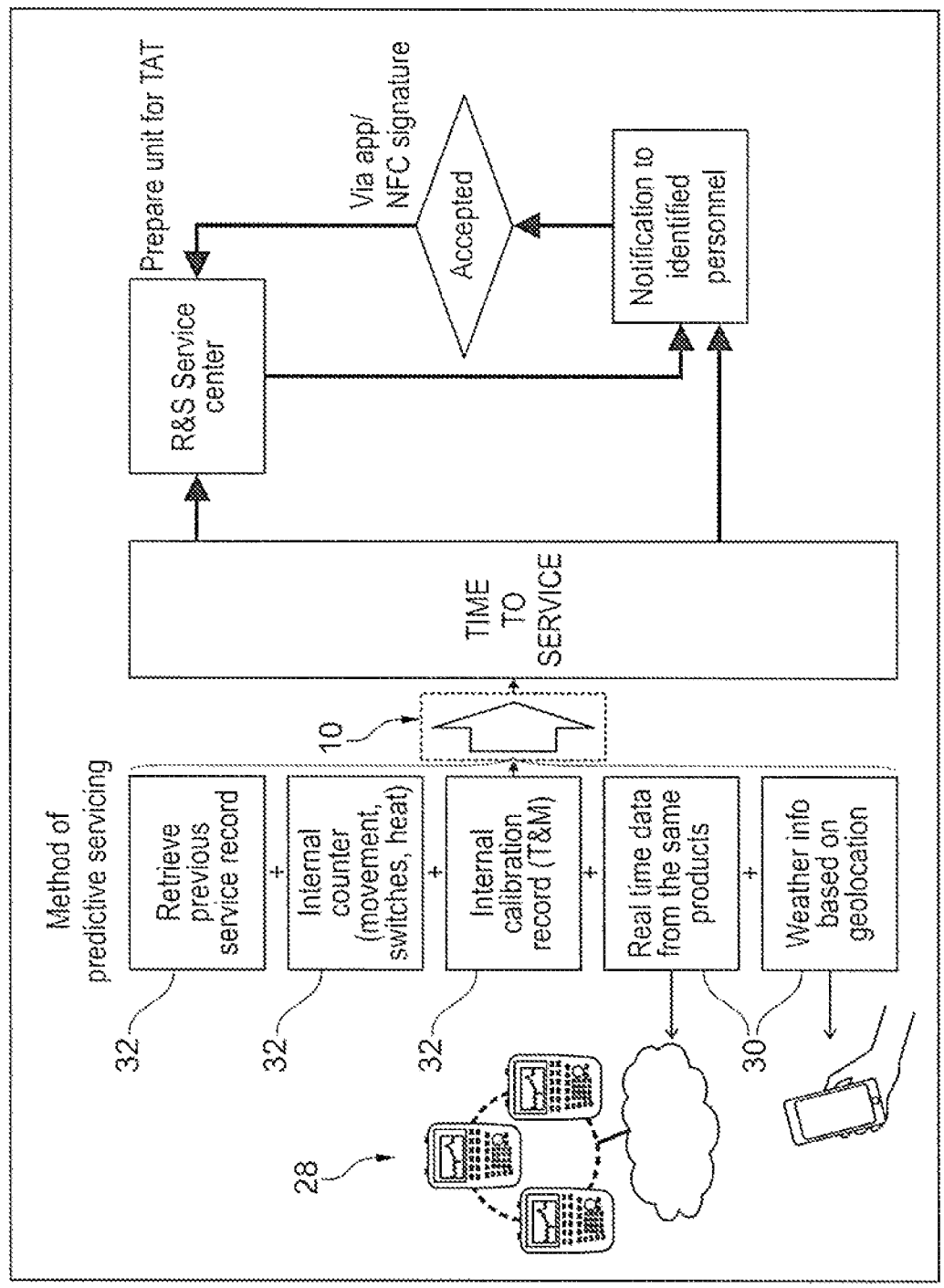
FIG. 2 schematically shows an overview of a system for illustrating a method according to an embodiment of the present disclosure.

Hereinafter, the determination of the time for maintenance and the notification are described in more detail while also referring to FIG. 2 providing an overview of the respective method for automatically notifying an intended person of a service interval of a test and measurement device 10.

In general, the test and measurement device 10, for example the active service check calculation unit 12, retrieves service data 28 that may relate to external data 30 and/or internal data 32 such as internal measurement data.

The internal measurement data may be gathered by the at least one internal sensor 18 wherein this internal measurement data may comprise information concerning the test and measurement device 10 such as movements of the test and measurement device 10, power on and power off cycles, idle time, usage time, expected lifetime, number of failed self alignments, and/or temperature profiles.

These different internal measurement data are inter alia used by the active service check calculation unit 12, for example the processing unit 14, in order to automatically calculate a time for maintenance (time to service) of the test and measurement device 10. Thus, the test and measurement device 10 can be referred to as a "smart" test and measurement device 10 as it can automatically calculate the upcoming time for maintenance based on service data 28 retrieved such as the internal measurement data provided by the internal sensor 18.

Besides the internal measurement data provided by the at least one internal sensor 18, the active service check calculation unit 12, for example the processing unit 14, may retrieve other internal data 32 as service data 28. This internal data 32 may relate to a previous maintenance record stored internally, for example in the memory 22, and/or an internal calibration record. As this data is stored within the test and measurement device 10, this data is called internal data 32.

The service data 28 may also comprise external data 30 that can be taken into account for calculating the time for maintenance. The external data 30 may be obtained via the communication interface 20. The external data 30 may be retrieved via the internet directly or indirectly. Thus, the communication interface 20 may be provided by a (W)LAN communication interface 20 such that the test and measurement device 10 is enabled to directly access server for obtaining external data 30.

For instance, the external data 30 may comprise data that relates to real time data from other test and measurement devices online that correspond to the respective test and measurement device 10. This data may also be stored in a cloud, namely a cloud server, wherein the cloud is run by a service provider of the test and measurement device 10. Accordingly, several other test and measurement devices 10 of the same kind are configured to store their respective data in the cloud such that this data can be accessed appropriately. Therefore, the data stored can be taken into account by the active service check calculation unit 12 for calculating the time for maintenance in an automatic manner.

In general, the test and measurement device 10 is configured to take the current status of these equivalent devices into account and check for anomalies or effects occurred that should be taken into account when calculating the time for maintenance.

In addition, a previous maintenance record of the test and measurement device 10 may be gathered via the internet provided that this maintenance record is stored externally, for instance on a server, for example in the cloud. This server may be run by the service department of the test and measurement device 10 wherein the server is accessed via the communication interface 20.

Alternatively or supplementary, the test and measurement device 10 establishes a communication connection with a web-enabled end device such as a mobile phone or a smartphone via the communication interface 20 that may be established by a NFC interface. Accordingly, the test and measurement device 10 is indirectly connected to the internet via the mobile phone or the smartphone.

For instance, the external data may comprise environmental data of the test and measurement device 10 wherein this environmental data is assigned to the geographic location of the test and measurement device 10. Hence, the environmental data may comprise weather information that is based on the geographic location.

In some embodiments, the geographic location of the test and measurement device 10 can be determined internally provided that the test and measurement device 10 comprises an appropriate GPS unit 34. Alternatively, the test and measurement device 10 uses the GPS unit of another device or unit with which a connection is established via the communication interface 20, for instance a smartphone or another end device.

All this information relates to service data 28 that is processed by the test and measurement device 10, for example the active service check calculation unit 12, in order to calculate the time for maintenance (time to service) of the test and measurement device 10 in an automatic manner.

As already mentioned, the test and measurement device 10 is configured to automatically notify the intended person with regard to the service interval of the device 10, for example to carry out the service check that is already due or that becomes due in the near future.

Therefore, a notification may be displayed on the display 16 of the test and measurement device 10 wherein information about the due time of the next service check is provided. For instance, a graphical user interface is displayed on the display 16 in order to notify the user in an appropriate manner. Alternatively, the display 16 or the light emitting unit 24 may emit a light signal in order to notify the user appropriately. Additionally or alternatively, a sound may be generated and outputted via the loudspeaker 26 in order to notify the user of the test and measurement device 10.

In some embodiments, a message such as a push notification may be sent to an (mobile) end device of the intended person in order to inform the intended person appropriately. The message may be an e-mail that is sent to an e-mail address stored internally.

As mentioned above, the person intended may be service personnel that is notified about the time for maintenance calculated, for example the already due service check or an upcoming one, in order to be prepared. When notifying the service personnel, information of the test and measurement device 10 may also be forwarded such that the service personnel is directly informed about any issues related to the test and measurement device 10 in the past. For instance, errors occurred during the last service interval are logged and forwarded directly to the service personnel in order to reduce the time spent during the service check. Alternatively or supplementarily, this information is uploaded to a server via the communication interface 20 such that the service personnel can access the relevant information prior to the service check.

The information forwarded with the notification may also relate to a serial number of the test and measurement device 10 such that the service personnel is enabled to contact the user of the test and measurement device 10 in order to arrange for a service check. The serial number may be linked to contact information of the user, for example at the service department internally.

In general, the active service check calculation unit 12, for example the processing unit 14, may take a threshold value into account that may relate to the internal measurement data. Thus, the notification is outputted once a certain measurement parameter reaches or exceeds the threshold value.

Alternatively, the threshold value relates to the remaining days until the due date of the service interval such that the notification is outputted once the remaining days are equal to the threshold value or the remaining days are less than the threshold value (being exceeded).

When the user gets notified about the upcoming service check to be done, an invitation may be sent simultaneously in order to arrange for a certain day. The user may accept this information, for instance via an application running on its end device, such that the service department may prepare for the service check. Accordingly, the notification may be a push-notification.

The acceptance may be proofed by a certain signature. The invitation may also be sent by the service personnel, for example the service department, that gets informed simultaneously.

As already mentioned, the service department and the user may be notified simultaneously such that the required resources on the service department site may already be allocated even though the exact date for the service check has not yet been accepted by the user.

Accordingly, a smart test and measurement device 10 is provided that automatically calculates its time for maintenances and informs the user and/or the service personnel automatically. This ensures that the test and measurement device 10 is always in an operational state, for instance calibrated appropriately. Moreover, unnecessary service checks can be avoided appropriately as it is ensured that the service check is done when it is necessary. The overall operational time of the test and measurement device 10 is extended.

Moreover, the user of the test and measurement device 10 gets more information about the current status of the test and measurement device 10 such that the user becomes trained and educated.

Various components of the test and measurement device 10 may include, in some embodiments, logic for implementing the technologies and methodologies described herein. This logic can be carried out in either hardware or software, or a combination of hardware and software. For example, in some embodiments, the processing unit 14 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the processing unit 14 includes a microprocessor and a memory storing logic modules and/or instructions. In an embodiment, the processing unit 14 includes one or more ASICs having a plurality of predefined logic components. In an embodiment, the processing unit 14 includes one or more FPGA having a plurality of programmable logic components. In an embodiment, the processing unit 14 includes hardware circuit implementations (e.g., implementations in analog circuitry, implementations in digital circuitry, and the like, and combinations thereof). In an embodiment, the processing unit 14 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for automatically notifying an intended person of a service interval of a test and measurement instrument by using the test and measurement instrument, comprising:
retrieving service data by a processing circuit of said test and measurement instrument, wherein said service data comprises internal data and external data, said external data comprising environmental data of said test and measurement instrument, said external data being gathered by said test and measurement instrument via at least one communication interface via which said test and measurement instrument is able to communicate with other units or devices, said internal data comprising internal measurement data of said test and measurement instrument, said internal measurement data comprising data related to at least one of movements of said test and measurement instrument, power on and power off cycles, idle time, usage time, number of failed self-alignments, or temperature profiles;
processing said service data internally by said processing circuit of said test and measurement instrument;
automatically calculating, by said test and measurement instrument, calibration times based on said service data retrieved such that neither a user nor a service personnel has to calculate an upcoming service interval manually, said service data being processed internally by the test and measurement instrument in order to predict the end of an actual service interval, wherein the service interval corresponds to a scheduled service that should take place regularly in order to keep the test and measurement device in its calibrated state; and
automatically notifying, by the processing circuit of the test and measurement instrument, at least one of the user of said test and measurement instrument or the service personnel with regard to the upcoming service interval of the test and measurement instrument so that at least one of the user of said test and measurement instrument or the service personnel is notified that a service check is already due or that becomes due in the near future, thereby ensuring that the regular service checks are done such that the test and measurement instrument is always in a calibrated state as the calibration times calculated correspond to the regularly scheduled services or service checks which are necessary to keep the test and measurement instrument in its calibrated state, thereby avoiding that the test and measurement instrument is used for testing purposes even though it is out of calibration or its calibration has expired,
wherein the test and measurement instrument includes one or more sensors configured to generate the internal data, a communications interface configured to receive the external data from a source external the test and measurement instrument; and a memory configured to store the service data.

2. The method according to claim 1, wherein said service data comprises information for predictive servicing of said test and measurement instrument.

3. The method according to claim 1, wherein said internal data comprises data of an internal calibration record.

4. The method according to claim 1, wherein said external data comprises data retrieved via the internet.

5. The method according to claim 4, wherein said data retrieved via the internet comprises data of a previous calibration record.

6. The method according to claim 4, wherein said data retrieved via the internet comprises data received from other test and measurement instruments of the same kind.

7. The method according to claim 1, wherein said environmental data comprises weather information based on the geographic location of said test and measurement instrument.

8. The method according to claim 1, wherein an information of said test and measurement instrument is forwarded when notifying said intended person.

9. The method according to claim 1, wherein a notification is outputted about at least one of an upcoming service and a service already due.

10. The method according to claim 9, wherein said notification is outputted by at least one of a graphic displayed, a light signal emitted, a sound generated, a message sent, or an information displayed on an end device of the intended person.

11. The method according to claim 1, wherein a threshold value is provided, wherein said notification is outputted when said threshold value is at least one of reached or exceeded.

12. A test and measurement instrument, comprising:
a housing;
at least one communication interface; and
an active service check calculation unit that is configured to calculate calibration times for the test and measurement device automatically, the active service check calculation unit housed in the housing, wherein the active service check calculation unit comprises a processing circuit that is configured, automatically, to:
retrieve the service data, wherein said service data comprises internal data and external data, said external data comprising environmental data of said test and measurement instrument, said external data being gathered by said test and measurement instrument via the at least one communication interface by which said test and measurement instrument is able to communicate with other units or devices, said internal data comprising internal measurement data of said test and measurement instrument, said internal measurement data comprising data related to at least one of movements of said test and measurement instrument, power on and power off cycles, idle time, usage time, number of failed self-alignments, or temperature profiles;
process said retrieved service data; and
calculate the calibration times automatically based on said retrieved service data, such that neither a user nor a service personal has to calculate an upcoming service interval manually, wherein the service interval corresponds to a scheduled service that should take place regularly in order to keep the test and measurement device in its calibrated state, thereby ensuring that the test and measurement device is always in the calibrated state as the calibration times calculated correspond to the regularly scheduled services or service checks which are necessary to keep the test and measurement device in its calibrated state, wherein every component used for calculating the calibration times are housed in the housing of the test and measurement instrument, and wherein the internal data includes internal measurement data and data of an internal calibration record, and wherein the test and measurement instrument further comprises:

one or more sensors housed in the housing, the one or more sensors configured to generate the internal measurement data;

a communications interface housed in the housing and configured to receive the external data from a source external the test and measurement device; and a memory configured to store the service data, wherein the internal calibration record is internally stored in the memory such that the test and measurement device is enabled to verify its own current status based upon the data of the internal calibration record corresponding to previous calibrations such that a service history of the test and measurement device is derivable.

13. A method for automatically notifying an intended person of a service interval of a test and measurement instrument by using the test and measurement instrument, comprising:

retrieving service data by a processing circuit of said test and measurement instrument, wherein said service data comprises internal data and external data, said internal data comprising internal measurement data of said test and measurement instrument, said internal measurement data comprising data related to at least one of movements of said test and measurement instrument, power on and power off cycles, idle time, usage time, number of failed self-alignments, or temperature profiles, said external data comprising environmental data of said test and measurement device, said external data being gathered by said test and measurement device via at least one communication interface by which said test and measurement device is enabled to communicate with other units or device, said external data also comprising data retrieved via the internet, said data retrieved via the internet comprising data received from other test and measurement instruments of the same kind such that test and measurement devices of the same kind upload their respective data in order to exchange the data via the internet with each other, thereby ensuring that the different test and measurement devices are configured to learn from each other;

processing said service data internally by said processing circuit of said test and measurement instrument;

calculating calibration times automatically based on said service data retrieved by said processing circuit of said test and measurement device such that a regularly service check is done, thereby ensuring that the test and measurement instrument is always in a calibrated state while automatically calculating the calibration times of the test and measurement instrument which are different to repairs of fault electronic components, thereby ensuring that the test and measurement device is always in a calibrated state as the calibration times calculated correspond to the regularly scheduled services or service checks which are necessary to keep the test and measurement device in its calibrated state, and wherein the test and measurement instrument includes one or more sensors configured to generate the internal data, a communications interface configured to receive the external data from a source external the test and measurement device; and a memory configured to store the service data.

14. The method according to claim 13, wherein machine learning algorithms are applied on the service data in order to generate a model for at least one of the different parameters used for calculating the calibration times.

15. The method according to claim 13, wherein said data retrieved via the internet comprising data received from other test and measurement instruments of the same kind include internal data of said other test and measurement instruments of the same kind, said internal data of said other test and measurement instruments of the same kind comprising internal measurement data of said other test and measurement instruments comprising data related to at least one of movements of said other test and measurement instruments, power on and power off cycles of said other test and measurement instruments, idle time of said other test and measurement instruments, usage time of said other test and measurement instruments, number of failed self-alignments of said other test and measurement instruments, or temperature profiles of said other test and measurement instruments.

16. The method according to claim 1, wherein unforeseen events or down times of the test and measurement instrument due to failures of electronic components are not predicted or taken into account while investigating degradation of these electronic components since the calibration times of the test and measurement instrument are different to repairs of fault electronic components such that it is only avoided that a test and measurement instrument is used for testing which is not calibrated or which calibration has expired.

17. The method according to claim 1, wherein the movements of said test and measurement device are monitored by an integrated gyrometer of said test and measurement device, wherein the temperature profiles are monitored by an integrated temperature sensor of said test and measurement device, and wherein the power on and power off cycles, the idle time, the usage time and the number of failed self-alignments are monitored by at least one of an integrated meter or counter of said test and measurement device.

18. The method according to claim 17, wherein said internal measurement data of said test and measurement instrument includes two of more types of data selected from the group consisting of data related to at least one of movements of said test and measurement instrument, power on and power off cycles, idle time, usage time, number of failed self-alignments, and temperature profiles.

19. The test and measurement instrument according to claim 12, wherein said test and measurement instrument has an integrated gyrometer capable of monitoring the movements of said test and measurement device, wherein said test and measurement instrument has an integrated temperature sensor capable of monitoring the temperature profiles, and wherein said test and measurement instrument has at least one of an integrated meter or counter capable of monitoring the power on and power off cycles, the idle time, the usage time and the number of failed self-alignments.

20. The method according to claim 13, wherein the movements of said test and measurement device are monitored by an integrated gyrometer of said test and measurement device, wherein the temperature profiles are monitored by an integrated temperature sensor of said test and measurement device, and wherein the power on and power off cycles, the idle time, the usage time and the number of failed self-alignments are monitored by at least one of an integrated meter or counter of said test and measurement device.

\* \* \* \* \*